(12) United States Patent
Yokogawa (10) Patent No.: US 7,409,648 B2
(45) Date of Patent: Aug. 5, 2008

(54) SEMICONDUCTOR INTEGRATED CIRCUIT, METHOD FOR DESIGNING SEMICONDUCTOR INTEGRATED CIRCUIT AND SYSTEM FOR DESIGNING SEMICONDUCTOR INTEGRATED CIRCUIT

(75) Inventor: Shinji Yokogawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 383 days.

(21) Appl. No.: 11/141,329

(22) Filed: Jun. 1, 2005

(65) Prior Publication Data

US 2005/0268257 A1    Dec. 1, 2005

(30) Foreign Application Priority Data

Jun. 1, 2004    (JP) ............................ P2004-162808

(51) Int. Cl.
*G06F 17/50*    (2006.01)
(52) U.S. Cl. .................... 716/1; 716/4; 716/5
(58) Field of Classification Search ................. 716/1–5, 716/10–13
See application file for complete search history.

(56) References Cited

U.S. PATENT DOCUMENTS

| | | | |
|---|---|---|---|
| 6,038,383 A | 3/2000 | Young et al. | |
| 6,597,049 B1 | 7/2003 | Bhattacharyya et al. | |
| 7,131,096 B1 * | 10/2006 | Balsdon et al. | ............... 716/13 |
| 2004/0049750 A1 * | 3/2004 | Gentry et al. | ................... 716/5 |

FOREIGN PATENT DOCUMENTS

| | | |
|---|---|---|
| JP | 6-348780 | 12/1994 |
| JP | 6-348780 A | 12/1994 |
| JP | 7-21246 | 1/1995 |
| JP | 07-021246 A | 1/1995 |
| JP | 2004-6833 A | 1/2004 |

* cited by examiner

*Primary Examiner*—Paul Dinh
(74) *Attorney, Agent, or Firm*—Sughrue Mion; PLLC (57) ABSTRACT

The semiconductor integrated circuit capable of reducing an interconnection width as compared with conventional one while suppressing electromigration effectively. An input unit 101 stores interconnection information in an interconnection information storage unit 104. An arithmetic operation unit 102 acquires the interconnection information upon accessing the interconnection information storage unit 104 and acquires an arithmetic operation parameter while accessing the arithmetic operation parameter storage unit 105 to determine a width W of the interconnection based on these values. That is, the width W of the interconnection is made to determine upon multiplying (current i)$^{1/3}$ by the arithmetic operation parameter (constant), which current is caused to flow through the interconnection.

6 Claims, 6 Drawing Sheets

SEMICONDUCTOR INTEGRATED CIRCUIT, METHOD FOR DESIGNING SEMICONDUCTOR INTEGRATED CIRCUIT AND SYSTEM FOR DESIGNING SEMICONDUCTOR INTEGRATED CIRCUIT

This application is based on Japanese patent application NO. 2004-162808, the content of which is incorporated hereinto by reference.

BACKGROUND OF THE INVENTION

1. Field of the Invention

The present invention relates to a semiconductor integrated circuit, a method for designing semiconductor integrated circuit and a system for designing semiconductor integrated circuit.

2. Description of Related Art

It is known that, when the current is continuously caused to flow through the metal interconnection of the semiconductor integrated circuit, disconnection or resistance degradation of the interconnection takes place depending on phenomenon of metal element transportation called as an electromigration.

When the current is caused to flow through the metal interconnection of the semiconductor integrated circuit, electron of electron flow and metal atoms collide. The electromigration is phenomenon where the metal atoms move in the direction of electron flow while receiving stress caused by momentum exchange on the occasion of the collision between electron of electron flow and metal atoms.

Porosities are accumulated in upstream of the electron flow caused by migration of the metal atom. A large amount of accumulated porosities form a hole called as an optically observable physical void. The void grows in the interconnection. There occurs such problems as electrical conductivity is lost; defect takes place in transmission of signal while increasing interconnection resistance, or the like in the interconnection where the void grows in certain degree of size. Also, it is known that an acceleration factor of this electromigration is current density and atmospheric temperature.

A service life of the interconnection deteriorates caused by the electromigration. In order to compliance with this interconnection life degradation, so far particularly restriction of the drive current has been adopted to cope with the degradation of the service life. As described in paragraph "0002" of the Japanese Laid-Open Patent Publication No. HEI 07-21246, required minimum line width of the conventional interconnection is designed in such a way that the required minimum line width increases directly proportional to the current amount caused to flow.

Figure 3:
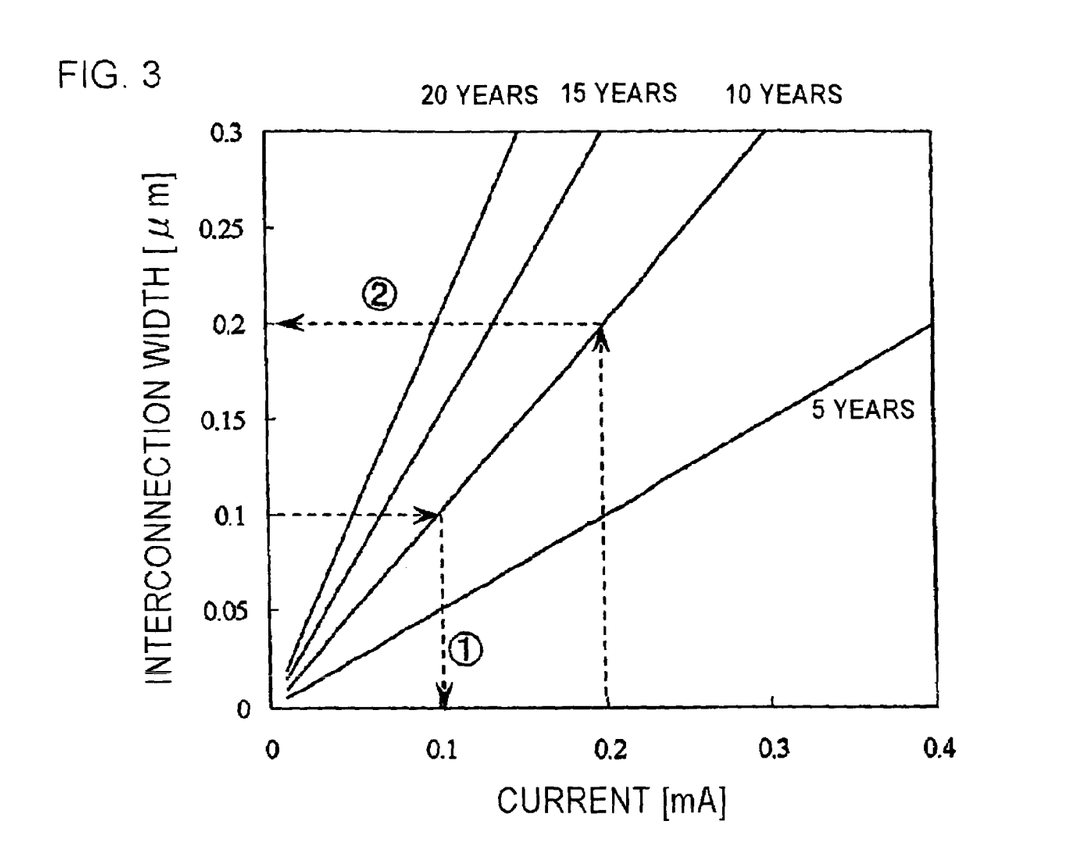
FIG. 3 is a diagram showing relationship of the current value, the interconnection width and a service life.

By applying this concept, an interconnection is formed on a semiconductor substrate with a damascene method. FIG. 3 is one which represents the interconnection width with current caused to flow through this interconnection in every service life of 5 years, 10 years, 15 years and 20 years. From this drawing, for instance, in the case that current of 0.1 mA is caused to flow through the interconnection with interconnection width: W=0.1 μm and the service life: 10 years; so, when current of 0.2 mA is caused to flow through the interconnection, this proves that it is necessary to design width W of the interconnection W=0.2 μm.

The semiconductor integrated circuit, which is designed in such a way as above conventional concept, increases the interconnection width directly proportional to increase of the current caused to flow through the interconnection. Accordingly, when being caused to flow large current, there has been the problem that a chip area becomes large. In particular, when the service life of the interconnection is long and the large current is caused to flow, there is the problem that extremely large chip area is necessary.

SUMMARY OF THE INVENTION

According to the present invention, there is provided a semiconductor integrated circuit having a first interconnection of a width $W_1$ through which a current $i_1$ is caused to flow and a second interconnection of a width $W_2$ through which a current $i_2$ is caused to flow, in which an equation $$\frac{W_1}{W_2} = \left(\frac{i_1}{i_2}\right)^{\frac{1}{3}}$$

specifies a relationship between the width $W_1$ of the first interconnection and the width $W_2$ of the second interconnection.

In this semiconductor integrated circuit, the first interconnection and the second interconnection may be copper interconnections.

Also, according to the present invention, there is provided a method for designing a semiconductor integrated circuit including a plurality of interconnections with different interconnection widths, when determining a width W of an interconnection included in the semiconductor integrated circuit, a value obtained in such a way as to multiply (current i)$^{1/3}$ by predetermined coefficient, which current is caused to flow through the interconnection, is made to determine as the width W.

Also, according to the present invention, there is provided a method for designing a semiconductor integrated circuit having a first interconnection of a width $W_1$ through which a current $i_1$ is caused to flow and a second interconnection of a width $W_2$ through which a current $i_2$ is caused to flow; and the method for designing the semiconductor integrated circuit comprises a step in which an equation $$\frac{W_1}{W_2} = \left(\frac{i_1}{i_2}\right)^{\frac{1}{3}}$$

determines an interconnection width ratio $W_1/W_2$.

Also, according to the present invention, there is provided a system for designing a semiconductor integrated circuit determining widths W of a plurality of interconnections included in the semiconductor integrated circuit, comprising: an interconnection information acquisition unit acquiring interconnection information including identification information specifying the interconnection, and a current value caused to flow into the interconnection that is related to the identification information, and an arithmetic operation unit determining a width W of its interconnection upon multiplying (current i)$^{1/3}$ by predetermined coefficient, which current is caused to flow through the interconnection, based on the acquired interconnection information.

Also, according to the present invention, there is provided a system for designing a semiconductor integrated circuit having a first interconnection of a width $W_1$ through which a current $i_1$ is caused to flow and a second interconnection of a width $W_2$ through which a current $i_2$ is caused to flow comprising: an interconnection information acquisition unit acquiring interconnection information including identification information specifying the interconnection, and a current value caused to flow into the interconnection that is related to the identification information, and an arithmetic operation unit determining an interconnection width ratio $W_1/W_2$ upon following an equation $$\frac{W_1}{W_2} = \left(\frac{i_1}{i_2}\right)^{\frac{1}{3}}$$

based on the acquired interconnection information.

As described later, the inventor has found that the interconnection width W is capable of possessing the same strength as the conventional one to the electromigration upon determining the interconnection width to a value proportional to (current i)$^{1/3}$, which current is caused to flow through the interconnection. The above invention has been achieved based on such new findings. According to the present invention described above, it is possible to reduce the interconnection width as compared to the conventional one while effectively suppressing the electromigration.

According to the present invention, it is possible to reduce the interconnection width as compared with conventional one while effectively suppressing the electromigration.

Figure 2A:
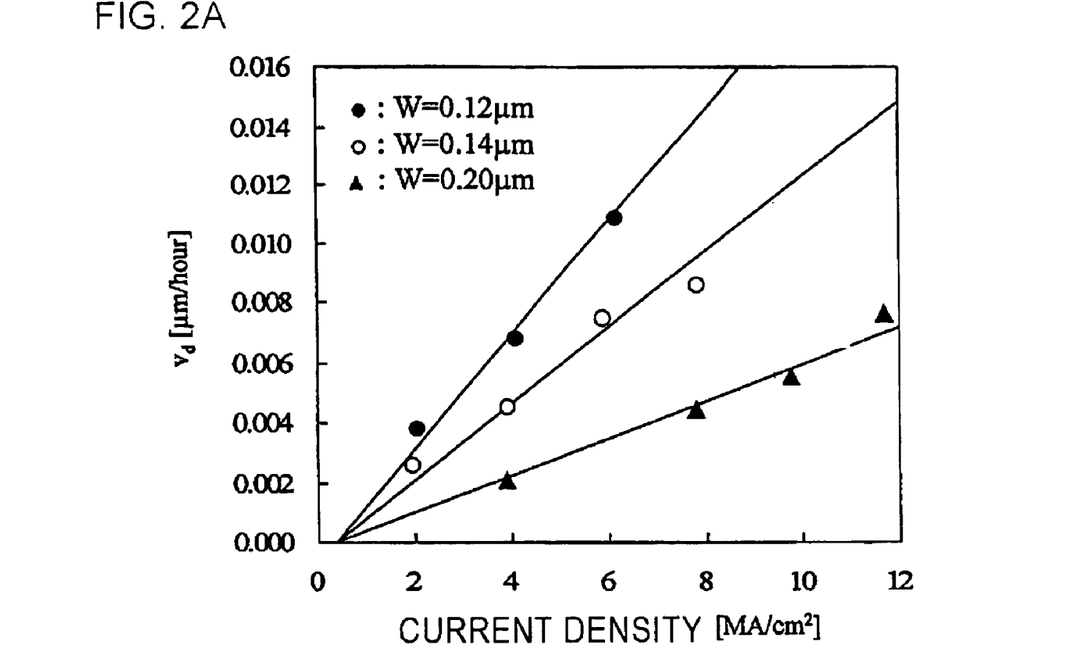
FIGS. 2A and 2B are diagrams showing relationship between the interconnection width and growth velocity of a void.
Figure 2B:
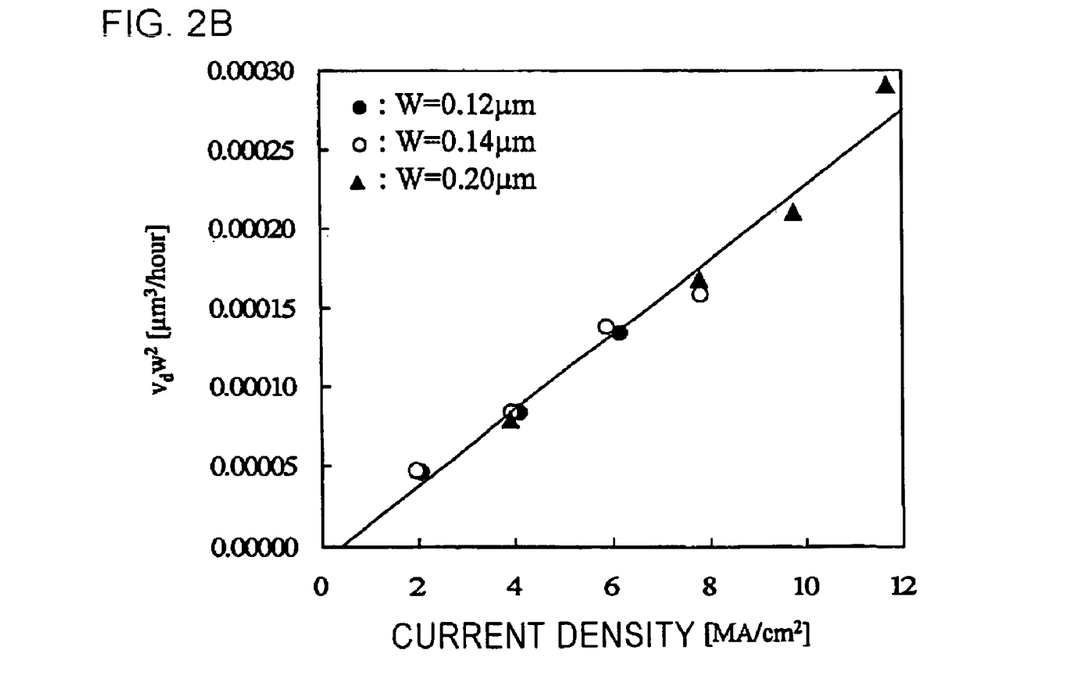

A copper interconnection is formed on the semiconductor integrated circuit using the damascene method. The inventor investigates relationship of velocity of void growth, which void is generated in the interconnection, to the current density caused to flow through the copper interconnection. There is obtained a result where the velocity of the void growth depends on the width of the interconnection as shown in FIG. 2A. And, from this data, there are obtained values in such a way as to raise the interconnection width to the second power, followed by multiplying these values by the velocity of the void growth to plot them to the current density. The inventor has found that the above plotted one gives a straight line as shown in FIG. 2B.

Consequently, relationship between the current and the interconnection width is capable of being represented as follows:

$$Vd \cdot W^2 = AJ \quad (1)$$

$$W^2 = \frac{A}{Vd}J = \frac{A}{Vd} \cdot \frac{i}{Wh} \quad \left(J = \frac{i}{Wh}\right)$$

$$W^3 = \frac{A}{Vd}\frac{1}{h}i$$

$$W = \left(\frac{A}{Vd}\frac{1}{h}i\right)^{\frac{1}{3}}$$

Figure 1:
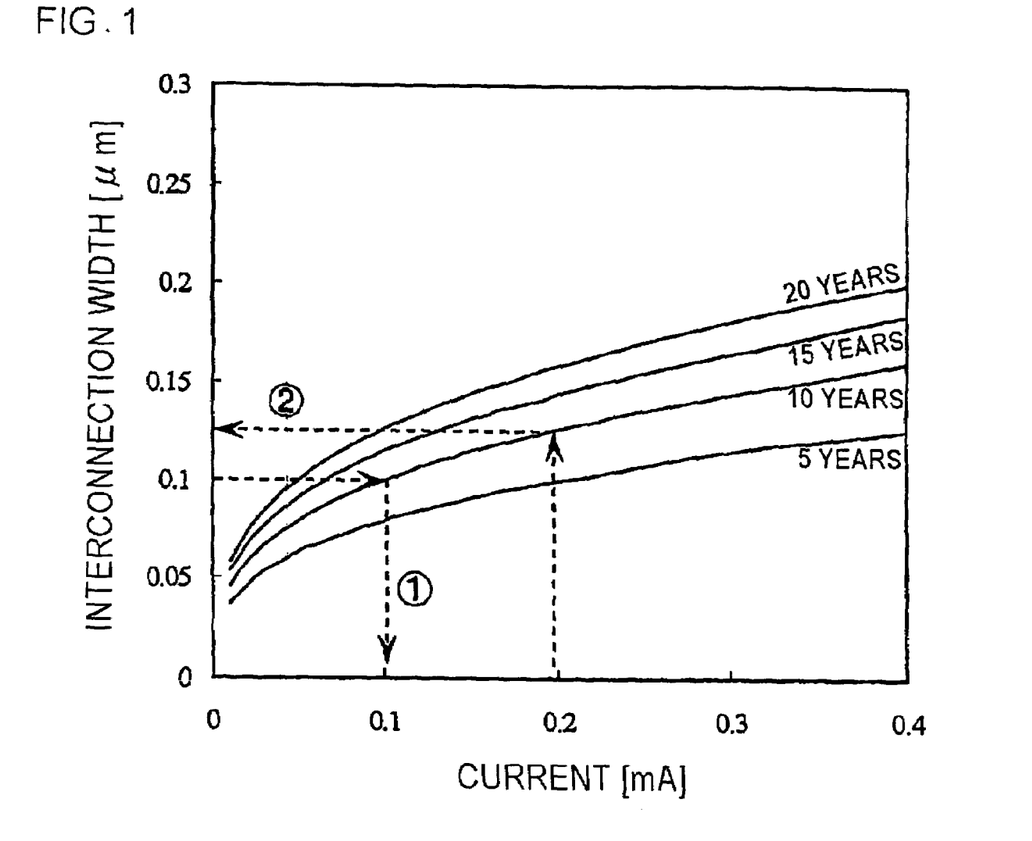
FIG. 1 is a diagram showing relationship of a current value, an interconnection width and a service life.

A: Inherent constant in process
J: Current density
i: Current
Vd: Velocity of void growth
h: Height of interconnection
W: Width of interconnection The inventor has found from the equation (1) that the interconnection is capable of possessing the same strength as the conventional one to the electromigration upon determining the interconnection width to the value proportional to (current i)$^{1/3}$, which current is caused to flow through the interconnection. This relationship is one shown in FIG. 1, in which the relationship is represented to each service life. From FIG. 1, in the case of the interconnection with the interconnection width W=0.1 μm and service life to be 10 years through which current of 0.1 mA is caused to flow, it is understood that, when the current of 0.2 mA is caused to flow through the interconnection, the width W of the interconnection W=0.126 μm can satisfy the necessary condition. Thereby, it is possible to reduce the interconnection width substantially as compared with the conventional 0.2 μm.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENT

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Hereinafter, there will be described a preferred embodiment of the present invention with reference to the drawings.

Figure 4:
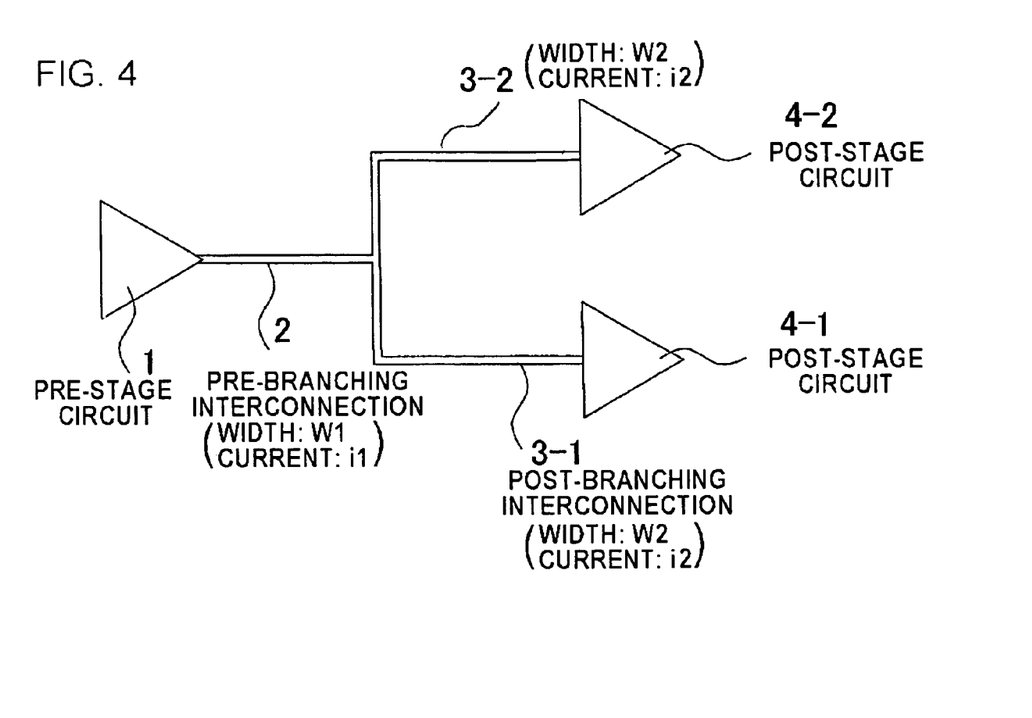
FIG. 4 is a diagram showing rough constitution of the semiconductor integrated circuit according to an embodiment.

FIG. 4 is a diagram showing rough constitution of the semiconductor integrated circuit according to the present embodiment. A circuit illustrated in FIG. 4 is formed above a semiconductor substrate; and an interconnection thereof is formed with a copper damascene method.

When the current is caused to flow in this circuit, the current flow is caused to flow in such a way that the current $i_1$ output from the pre-stage circuit 1 flows to a pre-branching interconnection 2 with an interconnection width $W_1$. Next, the current is branched; and a current $i_2$ with the same current value as a current $i_1$ is caused to flow into post-branching interconnections 3-1, 3-2, which have the same length and interconnection width $W_2$. The current results in state where respective currents are caused to flow through the post-stage circuits 4-1, 4-2. When designing this circuit while applying the conventional design concept, it is necessary for the circuit to design the interconnection width $W_1$ should be two times the interconnection width $W_2$ in that the current $i_1$ is two times the current $i_2$.

However, in the present invention, when finding relationship of W1, W2, i1 and i2, while using the equation (1), an equation $$\frac{W_1}{W_2} = \left(\frac{i_1}{i_2}\right)^{\frac{1}{3}} \quad (2)$$

is obtained.

From the equation (2) W1 is represented as follows:

$$W_1 = W_2 \times 2^{1/3}$$

Here, setting W2 =1 leads to W1=approximately 1.26. Consequently, it is possible to reduce the interconnection width by approximately 37% as compared with the conventional designed value. Specifically obtained interconnection width is a value, which is obtained in such a way that the interconnection width multiplies (current i)$^{1/3}$ by predetermined coefficient, which current is caused to flow through the interconnection.

In such a way as above, when determining the width of the interconnection while performing the arithmetic operation of equation (1) or (2), this makes it possible to reduce the interconnection width.

Figure 5:
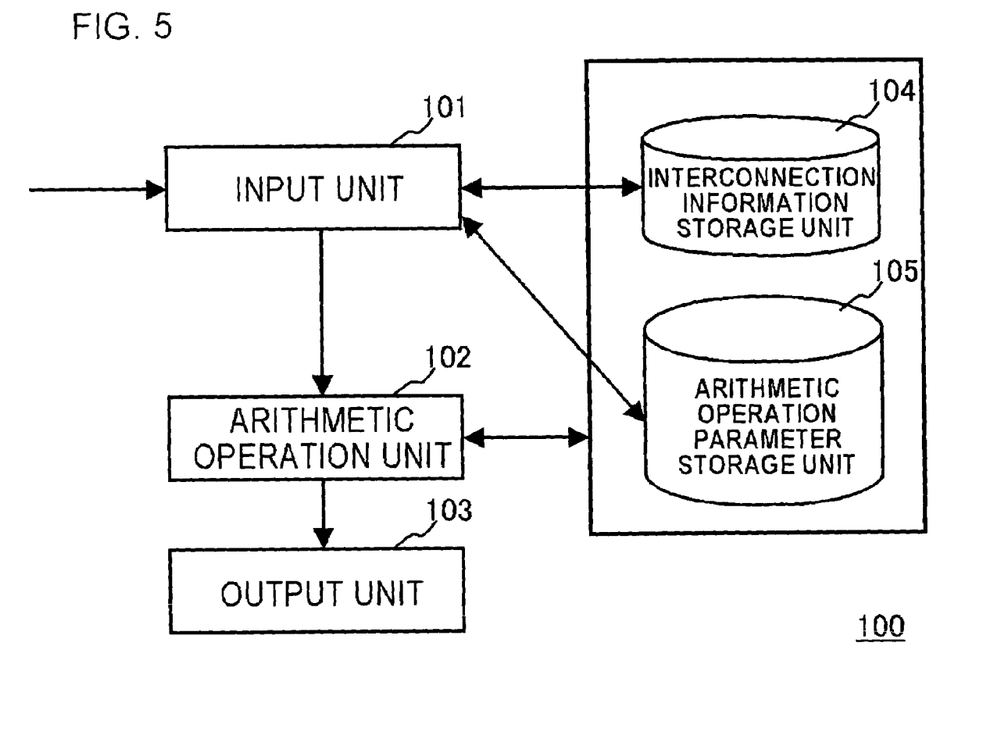
FIG. 5 is a diagram showing constitution of a system for designing a semiconductor integrated circuit according to the embodiment.

FIG. 5 is a functional block diagram of a system determining the interconnection width of the above semiconductor integrated circuit.

An input unit 101 (interconnection information acquisition unit) acquires the interconnection information input from the user and an arithmetic operation parameter. The interconnection information includes identification information specifying the interconnection and a current value caused to flow through the interconnection related to the identification information. The arithmetic operation parameter is a constant specified by the user; and it is used when determining the interconnection width W described later.

The input unit 101 stores the above interconnection information into an interconnection information storage unit 104.

An arithmetic operation unit 102 acquires the interconnection information upon accessing the interconnection information storage unit 104. Along with, the arithmetic operation unit 102 acquires an arithmetic operation parameter upon accessing an arithmetic operation parameter storage unit 105. The calculation unit 102 determines the width W of the interconnection based on these values. That is, the width W of the interconnection is determined in such a way as to multiply (current i)$^{1/3}$ by the arithmetic operation parameter (constant), which current is caused to flow through the interconnection. The above arithmetic operation is sequentially performed on a plurality of interconnections included in the semiconductor integrated circuit as being arithmetic operation targets; thus the interconnection width W is determined.

An output unit 103 outputs the width W of the determined interconnection to present the determined interconnection width W to the user.

Figure 6:
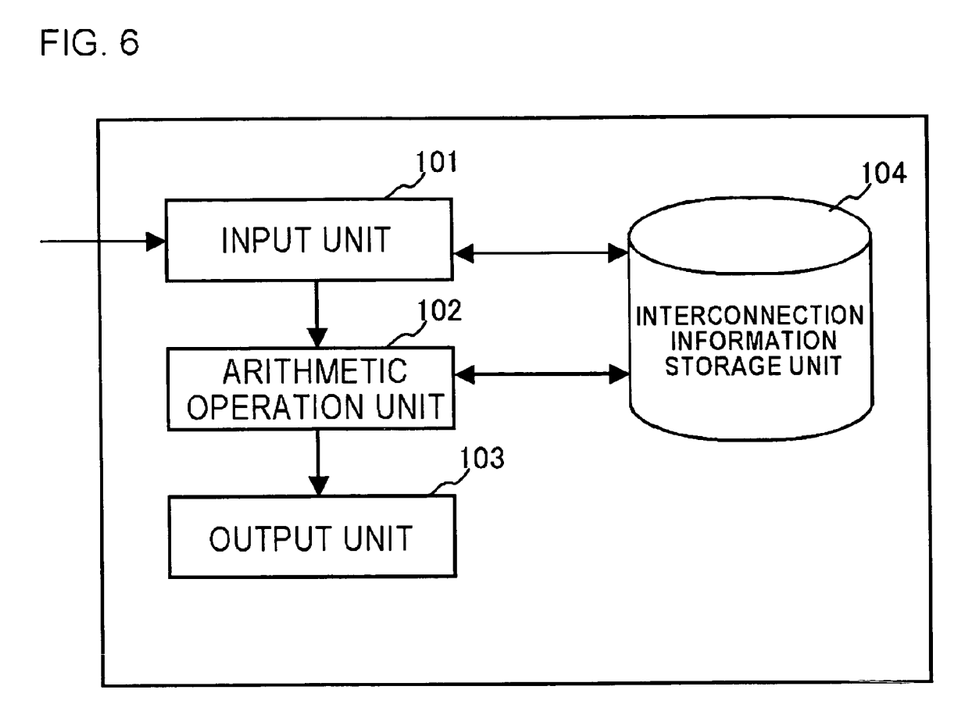
FIG. 6 is a diagram showing constitution of the system for designing the semiconductor integrated circuit according to the embodiment.

FIG. 6 is a diagram showing a mode of another system determining the interconnection width of the semiconductor integrated circuit. This system is one which performs a design of the semiconductor integrated circuit having the first interconnection with a width $W_1$ through which current $i_1$ is caused to flow and the second interconnection with a width $W_2$ through which current $i_2$ is caused to flow.

The input unit 101 acquires the interconnection information input from the user, and then the input unit 101 stores the interconnection information into the interconnection information storage unit 104.

The arithmetic operation unit 102 acquires the interconnection information while accessing the interconnection information storage unit 104; and then the arithmetic operation unit 102 determines the width W of the interconnection based on these information.

That is, the equation:

$$\frac{W_1}{W_2} = \left(\frac{i_1}{i_2}\right)^{\frac{1}{3}}$$

determines the interconnection width ratio W1/W2.

The above arithmetic operation is sequentially performed on a plurality of interconnections included in the semiconductor integrated circuit as being the arithmetic operation target; thus the interconnection width ratio is determined. After that, values of the interconnection widths are determined so as to satisfy the interconnection width ratio of the respective interconnections. The specific interconnection width results in the value obtained in such a way as to multiply (current i)$^{1/3}$ by predetermined coefficient, which current is caused to flow through the interconnection.

The output unit 103 outputs the width W of the interconnection determined in such a way as above to present it to the user.

As above, there has been described the embodiment of the present invention with reference to the drawings. However, these are only exemplifications of the present invention, so it is possible to adopt various constitutions in addition to the above.

For instance, in the above embodiment, there has been shown the example of the semiconductor integrated circuit having two kinds of the interconnection widths. However, the present invention is generally applicable to the semiconductor integrated circuit having n (n is natural number not less than 2) kinds of the interconnection widths. In that case, the interconnection widths $W_1, \ldots W_n$ of the interconnection are suitable to be designed to satisfy $W_k/W_{k+1} = (i_k/i_{k+1})^{1/3}$ (the width of the interconnection through which the current $i_k$ is caused to flow is taken to as $W_k$. "k" is natural number not less than "1" to not more than "n−1"). Only a part of the interconnection which is necessary to be subjected to reduction in the interconnection of the semiconductor integrated circuit is capable of being set to a target to determine the interconnection width depending on the method described in the above embodiment. That is, the method determining the interconnection width is applicable to only the necessary part. It is not necessarily to be necessary to apply to the whole interconnection.

For instance, in one region of the semiconductor integrated circuit, it is possible to realize constitution in which there are provided "n" ("n" is natural number not less than 2) kinds of interconnections, and the interconnection widths $W_1, \ldots W_n$ of the interconnection are designed so as to satisfy $W^k/W_{k+1} = (i_k/i_{k+1})^{1/3}$ (the width of the interconnection through which the current $i_k$ is caused to flow is taken to as $W_k$. "k" is natural number not less than "1" to not more than "n−1").

It is apparent that the present invention is not limited to the above embodiment that modified and changed without departing from the scope and sprit of the invention.

What is claimed is:

1. A semiconductor integrated circuit having a first interconnection of width $W_1$ through which a current $i_1$ is caused to flow and a second interconnection of width $W_2$ through which a current $i_2$ is caused to flow, in which said width $W_1$ of said first interconnection and said width $W_2$ of said second interconnection satisfy a relationship specified by the following equation:

$$\frac{W_1}{W_2} = \left(\frac{i_1}{i_2}\right)^{\frac{1}{3}}.$$

2. The semiconductor integrated circuit according to claim 1, wherein, in one region of the semiconductor integrated circuit, there are provided "n" ("n" is natural number not less than 2) kinds of interconnection, and the interconnection widths $W_1, \ldots W_n$ of the interconnection are designed so as to satisfy $W_k/W_{k+1}=(i_k/i_{k+1})^{1/3}$ (the width of the interconnection through which the current $i_k$ is caused to flow is taken to as $W_k$; and "k" is natural number not less than "1" to not more than "n−1").

3. The semiconductor integrated circuit according to claim 1, wherein both said first interconnection and said second interconnection are copper interconnections.

4. A method for designing the semiconductor integrated circuit having a first interconnection of a width $W_1$ through which a current $i_1$ is caused to flow and a second interconnection of a width $W_2$ through which a current $i_2$ is caused to flow comprising a step determining an interconnection width ratio $W_1/W_2$ by following below equation:

$$\frac{W_1}{W_2} = \left(\frac{i_1}{i_2}\right)^{\frac{1}{3}}$$

5. The method for designing the semiconductor integrated circuit according to claim 4, wherein said semiconductor integrated circuit has "n" ("n" is natural number not less than 2) kinds of interconnections with different interconnection widths in its one region and comprises a step determining the interconnection widths $W_1, \ldots W_n$ of the interconnection so as to satisfy $W_k/W_{k+1}=(i_k/i_{k+1})^{1/3}$ (the width of the interconnection through which the current $i_k$ is caused to flow is taken to as $W_k$; and "k" is natural number not less than "1" to not more than "n−1").

6. A system for designing a semiconductor integrated circuit having a first interconnection of a width $W_1$ through which a current $i_1$ is caused to flow and a second interconnection of a width $W_2$ through which a current $i_2$ is caused to flow comprising:

an interconnection information acquisition unit acquiring interconnection information including identification information specifying the interconnection, and a current value caused to flow into said interconnection that is related to said identification information; and an arithmetic operation unit determining an interconnection width ratio $W_1/W_2$ based on the acquired interconnection information upon following below equation:

$$\frac{W_1}{W_2} = \left(\frac{i_1}{i_2}\right)^{\frac{1}{3}}$$

* * * * *